US011024507B2

(12) United States Patent
Sato et al.

(10) Patent No.: US 11,024,507 B2
(45) Date of Patent: Jun. 1, 2021

(54) SUBSTRATE LIQUID PROCESSING APPARATUS, SUBSTRATE LIQUID PROCESSING METHOD, AND COMPUTER-REDABLE STORAGE MEDIUM HAVING SUBSTRATE LIQUID PROCESSING PROGRAM STORED THEREIN

(71) Applicant: Tokyo Electron Limited, Tokyo (JP)

(72) Inventors: Hideaki Sato, Kumamoto (JP); Jinhyun Kim, Gyeonggi-do (KR)

(73) Assignee: TOKYO ELECTRON LIMITED ( * ) Notice: Subject to any disclaimer, the term of this patent is extended or adjusted under 35 U.S.C. 154(b) by 361 days.

(21) Appl. No.: 16/089,670

(22) PCT Filed: Feb. 9, 2017

(86) PCT No.: PCT/JP2017/004681
§ 371 (c)(1),
(2) Date: Sep. 28, 2018

(87) PCT Pub. No.: WO2017/169155
PCT Pub. Date: Oct. 5, 2017

(65) Prior Publication Data
US 2020/0312667 A1 Oct. 1, 2020

(30) Foreign Application Priority Data
Mar. 31, 2016 (JP) .............................. JP2016-069977

(51) Int. Cl.
H01L 21/306 (2006.01)
H01L 21/311 (2006.01)
H01L 21/67 (2006.01)

(52) U.S. Cl.
CPC ...... H01L 21/306 (2013.01); H01L 21/30604 (2013.01); H01L 21/31105 (2013.01); H01L 21/67075 (2013.01)

(58) Field of Classification Search
None
See application file for complete search history.

(56) References Cited

U.S. PATENT DOCUMENTS

2013/0240143 A1\* 9/2013 Kiyose ............. H01L 21/67057
156/345.15

FOREIGN PATENT DOCUMENTS

| JP | 07-022383 A | 1/1995 |
| JP | 2003-282527 A | 10/2003 |
| JP | 2009-266984 A | 11/2009 |

OTHER PUBLICATIONS

International Search Report dated Mar. 21, 2017 for WO 2017/169155 A1.

\* cited by examiner

Primary Examiner — Alexander G Ghyka
(74) Attorney, Agent, or Firm — Abelman, Frayne & Schwab

(57) ABSTRACT

In a substrate liquid processing method for performing an etching process by bringing an etching liquid for removing a coating film into contact with a surface of a substrate having a recess and covered with a coating film inside and outside the recess, the substrate liquid processing method includes: a first coating film removal step of setting the etching liquid to a first temperature so as to attain a first etching rate and removing the coating film outside the recess in a first process time; and thereafter, a second coating film removal step of setting the etching liquid to a second temperature so as to attain a second etching rate lower than the first etching rate and removing the coating film outside the recess in the second process time while leaving the coating film inside the recess.

20 Claims, 4 Drawing Sheets

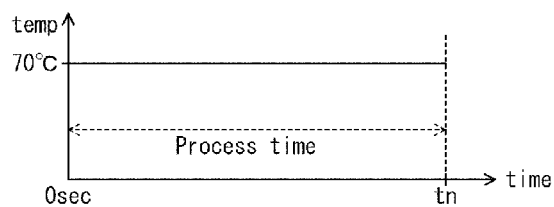
FIG. 5A
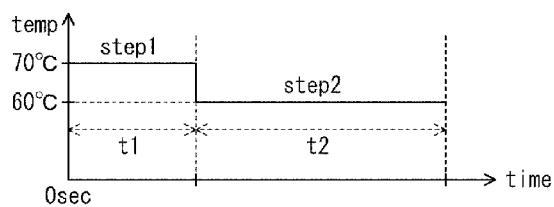
FIG. 5B
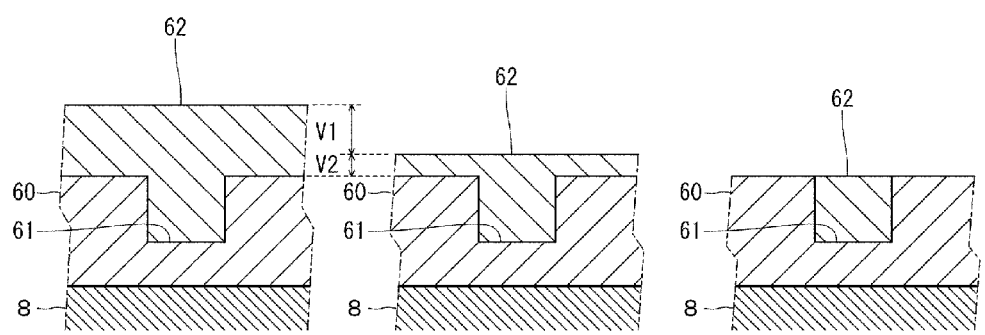
FIG. 6A     FIG. 6B     FIG. 6C

SUBSTRATE LIQUID PROCESSING APPARATUS, SUBSTRATE LIQUID PROCESSING METHOD, AND COMPUTER-REDABLE STORAGE MEDIUM HAVING SUBSTRATE LIQUID PROCESSING PROGRAM STORED THEREIN

CROSS REFERENCE TO RELATED APPLICATIONS

This application is a national phase of PCT application No. PCT/JP2017/004681, filed on 9 Feb. 2017, which claims priority from Japanese Patent Application No. 2016-069977, filed on 31 Mar. 2016, all of which are incorporated herein by reference.

TECHNICAL FIELD

The present disclosure relates to a substrate liquid processing apparatus, a substrate liquid processing method, and a computer-readable storage medium having a substrate liquid processing program stored therein.

BACKGROUND

In manufacturing a semiconductor component or a flat panel display, a substrate liquid processing apparatus is used to perform a processing such as, for example, etching on a substrate such as, for example, a semiconductor wafer or a liquid crystal substrate using a processing liquid such as, for example, an etching liquid.

For example, in a semiconductor device manufacturing process, there is known a method in which a contact hole (a recess) is formed in an insulating film on the surface of the substrate, a coating film (e.g., a metal layer of tungsten) is deposited on the insulating film inside and outside the recess, and then an etching liquid (e.g., an etching liquid obtained by mixing, for example, phosphoric acid, nitric acid, and acetic acid) is set to a temperature (70° C. or higher) at which the etching rate of the metal layer is high, and the metal layer outside the recess is etched (Patent Document 1).

PRIOR ART DOCUMENT

Patent Document

Patent Document 1: Japanese Patent Laid-Open Publication No. 2009-266984

SUMMARY OF THE INVENTION

Problem to be Solved

At this time, a liquid processing may be performed in a short time such that the metal layer inside the recess is not etched as much as possible, and the remaining film of the metal layer outside the recess is thinned as much as possible or the metal layer does not remain outside the concave portion.

However, in a conventional wet etching method, when a metal layer is processed with an etching liquid having a temperature at which an etching rate is high, the metal layer may be removed in a short time, but the metal layer inside the recess may also be etched.

Means to Solve the Problem

Thus, according to the present disclosure, in a substrate liquid processing method for performing an etching process by bringing an etching liquid for removing a coating film into contact with a surface of a substrate having a recess and covered with a coating film inside and outside the recess, the substrate liquid processing method includes: a first coating film removal step of setting the etching liquid to a first temperature so as to attain a first etching rate and removing the coating film outside the recess in a first process time; and thereafter, a second coating film removal step of setting the etching liquid to a second temperature in a second process time so as to attain a second etching rate lower than the first etching rate and removing the coating film outside the recess in the second process time while leaving the coating film inside the recess.

In addition, according to the present disclosure, in a substrate liquid processing apparatus for performing an etching process by bringing an etching liquid for removing a coating film into contact with a surface of a substrate having a recess and covered with a coating film inside and outside the recess, the substrate liquid processing apparatus includes: an etching liquid supply unit configured to supply the etching liquid to the surface of the substrate in order to remove a portion of the coating film that covers the surface outside the recess; and a controller configured to control the etching liquid supply unit. The controller is configured to: control the etching liquid supply unit such that a temperature of the etching liquid supplied to the surface of the substrate from the etching liquid is set to a first temperature so as to attain a first etching rate and the coating film outside the recess is removed in a first process time; and thereafter, control the etching liquid supply unit such that the temperature of the etching liquid is set to second temperature so as to attain a second etching rate lower than the first etching rate and the coating film outside the recess is removed while leaving the coating film inside the recess in the second process time.

Effect of the Invention

The present disclosure is capable of etching a coating film outside a recess in a substrate with high accuracy while leaving the coating film inside the recess in the substrate.

BRIEF DESCRIPTION OF THE DRAWINGS

FIGS. 5A and 5B are an explanatory views illustrating changes in time and temperature during an etching process.

FIGS. 6A to 6C are explanatory views illustrating a change in removal of a coating film with respect to changes in time and temperature during an etching process.

DETAILED DESCRIPTION TO EXECUTE THE INVENTION

Hereinafter, specific configurations of a substrate liquid processing apparatus, a substrate liquid processing method, and the substrate liquid processing program according to the present disclosure will be described with reference to the drawings.

Figure 1:
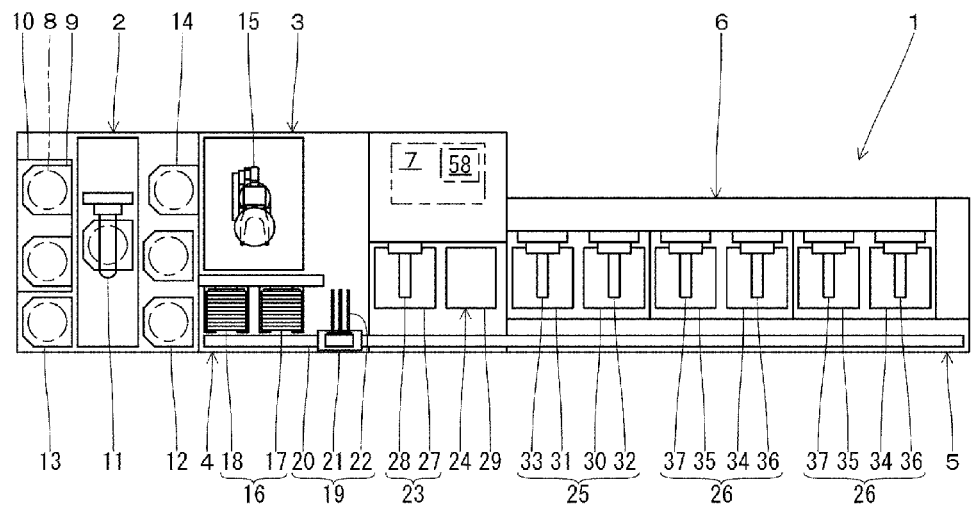
FIG. 1 is a plan explanatory view illustrating a substrate liquid processing apparatus.

As illustrated in FIG. 1, the substrate liquid processing apparatus 1 includes a carrier carry-in/out section 2, a lot forming section 3, a lot placing section 4, a lot transport section 5, a lot processing section 6, and a controller 7.

The carrier carry-in/out section 2 is configured to perform carry-in/out of a carrier 9 containing a plurality of (e.g., 25) substrates (silicon wafers) 8 aligned vertically in a horizontal posture.

The carrier carry-in/out section 2 is provided with a carrier stage 10 on which a plurality of carriers 9 are placed, a carrier transport mechanism 11 configured to transport the carriers 9, carrier stocks 12, 13 configured to temporarily store the carriers 9 therein, and a carrier mounting table 14 configured to mount a carrier 9 thereon. Here, the carrier stock 12 temporarily stores substrates 8 to be made into products before processing the substrates 8 in the lot processing section 6. Further, the carrier stock 13 temporarily stores the substrates 8 to be made into products after processing the substrates 8 in the lot processing section 6.

Then, the carrier carry-in/out section 2 is configured to transport a carrier 9 carried from the outside into the carrier stage 10 to the carrier stock 12 or the carrier mounting table 14 using the carrier transport mechanism 11. Then, the carrier carry-in/out section 2 is configured to transport the carrier 9 mounted on the carrier mounting table 14 to the carrier stock 13 or the carrier stage 10 using the carrier transport mechanism 11. The carrier 9 transported to the carrier stage 10 is carried out to the outside.

The lot forming section 3 forms a lot consisting of a plurality of (e.g., 50) substrates 8 that are processed simultaneously by combining the substrates 8 accommodated in one or more carriers 9.

The lot forming section 3 is provided with a substrate transport mechanism 15 configured to transport a plurality of substrates 8. In addition, the substrate transport mechanism 15 is capable of changing the posture of the substrates 8 from the horizontal posture to the vertical posture and from the vertical posture to the horizontal posture in the middle of the transport of the substrates 8.

Then, the lot forming section 3 transports the substrates 8 from the carrier 9 placed on the carrier mounting table 14 to the lot placing section 4 using the substrate transport mechanism 15, and places the substrates 8 forming a lot on the lot placing section 4. Further, the lot forming section 3 transports the lot placed on the lot placing section 4 to the carrier 9 placed on the carrier mounting table 14 by the substrate transport mechanism 15. In addition, the substrate transport mechanism 15 includes two types of support supports each configured to support a plurality of substrates 8, i.e. a pre-processing substrate support configured to support the substrates 8 before processing (before being transported by the lot transport section 5), and a post-processing substrate support configured to support the substrates 8 after processing (after being transported by the lot transport section 5). This prevents particles adhering to the substrates 8 before processing from being transferred to, for example, the processed substrates 8.

The lot placing section 4 is configured to temporarily place (stand by), on a lot placing table 16, a lot to be transported between the lot forming section 3 and the lot processing section 6 by the lot transport section 5.

The lot placing section 4 is provided with a carry-in side lot placing table 17 configured to place a lot before processing (before being transported by the lot transport section 5) thereon and a carry-out side lot placing table 18 configured to place a lot after processing (after being transported by the lot transport section 5) thereon. A plurality of substrates 8 for one lot are aligned on the front and back in the vertical posture on the carry-in side lot placing table 17 and the carry-out side lot placing table 18.

Then, in the lot placing section 4, a lot formed by the lot forming section 3 is placed on the carry-in side lot placing table 17, and the lot is carried into the lot processing section 6 via the lot transport section 5. In addition, in the lot placing section 4, the lot carried out from the lot processing section 6 via the lot transport section 5 is placed on the carry-out side lot placing table 18, and the lot is transported to the lot forming section 3.

The lot transport section 5 transport lots between the lot placing section 4 and the lot processing section 6 or between internal portions of the lot processing section 6.

This lot transport section 5 is provided with a lot transport mechanism 19 configured to transport a lot. The lot transport mechanism 19 includes a rail 20 disposed along the lot placing section 4 and the lot processing section 6 and a moving body 21 configured to move along the rail 20 while holding a plurality of substrates 8. A substrate holder 22 configured to hold a plurality of substrates 8 aligned on the front and rear in a vertical posture is provided on the movable body 21 so as to be movable back and forth.

Then, the lot transport section 5 receives the lot placed on the carry-in side lot placing table 17 with the substrate holder 22 of the lot transport mechanism 19, and delivers the lot to the lot processing section 6. In addition, the lot transport section 5 receives the lot processed in the lot processing section 6 with the substrate holder 22 of the lot transport mechanism 19, and delivers the lot to the carry-out side lot placing table 18. Further, the lot transport section 5 transports the lot within the lot processing section 6 using the lot transport mechanism 19.

The lot processing section 6 performs processings such as, for example, etching, cleaning, and drying on a plurality of substrates 8 aligned on the front and rear in the vertical posture as one lot.

The lot processing section 6 include a drying apparatus 23 configured to perform a drying process of the substrates 8, a substrate holder cleaning apparatus 24 configured to perform a cleaning process of the substrate holder 22, a cleaning apparatus 25 configured to perform a cleaning process of the substrates 8, and two etching apparatuses 26 configured to perform an etching process of the substrates 8, which are provided side by side.

In the drying apparatus 23, a substrate lifting mechanism 28 is provided in a processing tank 27 so as to be movable up and down. A processing gas for drying (e.g., isopropyl alcohol (IPA)) is supplied to the processing tank 27. In the substrate lifting mechanism 28, a plurality of substrates 8 for one lot are aligned and held on the front and rear in the vertical posture. The drying apparatus 23 receives the lot from the substrate holder 22 of the lot transport mechanism 19 with the substrate lifting mechanism 28 and moves up and down the lot by the substrate lifting mechanism 28, thereby performing the drying process of the substrates using the processing gas for drying supplied to the processing tank 27. Further, the drying apparatus 23 delivers the lot from the substrate lifting mechanism 28 to the substrate holder 22 of the lot transport mechanism 19.

The substrate holder cleaning apparatus 24 is configured to be able to supply a processing liquid for cleaning and a drying gas to the processing tank 29. After supplying the processing liquid for cleaning to the substrate holder 22 of the lot transport mechanism 19, the cleaning process of the substrate holder 22 is performed by supplying the dry gas.

The cleaning apparatus 25 includes a processing tank 30 for cleaning and a processing tank 31 for rinsing, and substrate lifting mechanisms 32, 33 are respectively provided in the processing tanks 30, 31 so as to be movable up and down. In the processing tank 30 for cleaning, a processing liquid for cleaning (e.g., SC-1) is stored. In the processing tank 31 for rinsing, a processing liquid for rinsing (e.g., pure water) is stored.

The etching apparatus 26 includes a processing tank 34 for etching and a processing tank 35 for rinsing, and substrate lifting mechanisms 36, 37 are respectively provided in the processing tanks 34, 35 so as to be movable up and down. In the etching tank 34, a processing liquid for etching is stored. In the processing tank 35 for rinsing, a processing liquid for rinsing (e.g., pure water) is stored.

The cleaning apparatus 25 and the etching apparatus 26 have the same configuration. With respect to the etching apparatus 26, a plurality of substrates 8 for one lot are aligned and held on the front and rear in the vertical posture in the substrate lifting mechanisms 36, 37. The etching apparatus 26 receives the lot from the substrate holder 22 of the lot transport mechanism 19 by the substrate lifting mechanism 36 and moves up and down the lot by the substrate lifting mechanism 36, thereby immersing the lot in the processing liquid for etching in the processing tank 34 so as to perform the etching process of the substrates 8. Thereafter, the etching apparatus 26 delivers the lot from the substrate lifting mechanism 36 to the substrate holder 22 of the lot transport mechanism 19. In addition, the etching apparatus 26 receives the lot from the substrate holder 22 of the lot transport mechanism 19 by the substrate lifting mechanism 37, and moves up and down the lot by the substrate lifting mechanism 37, thereby immersing the lot in the processing liquid for rinsing in the processing tank 35 so as to perform the rinsing process of the substrates 8. Thereafter, the etching apparatus 26 delivers the lot from the substrate lifting mechanism 37 to the substrate holder 22 of the lot transport mechanism 19.

The controller 7 controls the operations of respective sections (e.g., the carrier carry-in/out section 2, the lot forming section 3, the lot placing section 4, the lot transport section 5, and the lot processing section 6) of the substrate liquid processing apparatus 1.

The controller 7 is, for example, a computer, and includes a computer-readable storage medium 58. In the storage medium 58, a program for controlling various processes executed in the substrate liquid processing apparatus 1 is stored. The controller 7 controls the operations of the substrate liquid processing apparatus 1 by reading and executing the program stored in the storage medium 58. The program may have been stored in the computer-readable storage medium 58 and installed from the other storage medium to the storage medium 58 of the controller 7. The computer-readable storage medium 58 includes, for example, a hard disk (HD), a flexible disk (FD), a compact disk (CD), a magneto-optical disk (MO), and a memory card.

In this etching apparatus 26, a substrate 8 is subjected to a liquid processing (etching process) using a processing liquid (etching liquid) in which various kinds of chemicals of a predetermined concentration and pure water are mixed.

Figure 2:
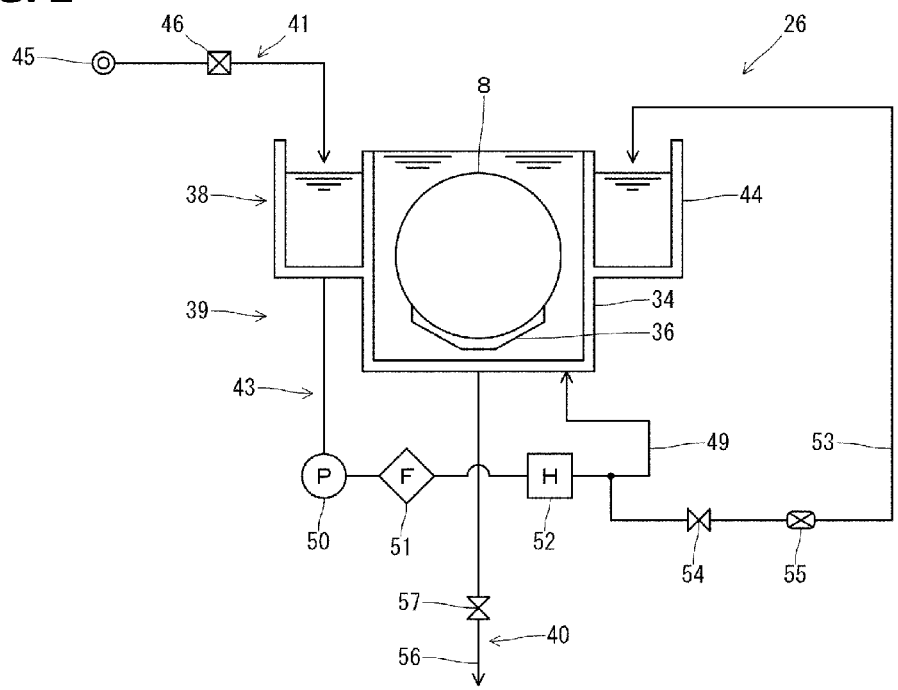
FIG. 2 is an explanatory view illustrating an etching apparatus.

As illustrated in FIG. 2, the etching apparatus 26 includes a liquid processing unit 38 configured to store the processing liquid and perform a liquid processing on the substrate 8, an etching liquid supply unit 39 configured to supply the processing liquid to the liquid processing unit 38, and a processing liquid discharge unit 40 configured to discharge the processing liquid from the liquid processing unit 38. The etching liquid supply unit 39 includes a chemical liquid supply unit 41 configured to supply a processing liquid to the liquid processing unit 38 and a processing liquid circulation unit 43 configured to circulate the processing liquid stored in the liquid processing unit 38.

The liquid processing section 38 forms a top-opened outer tank 44 around the upper portion of the processing tank 34, and stores a processing liquid in the processing tank 34 and the outer tank 44. In the processing tank 34, the processing liquid is stored such that the substrate 8 is immersed therein by the substrate lifting mechanism 36 such that the substrate 8 is subjected to a liquid processing. In the outer tank 44, the processing liquid overflowing from the processing tank 34 is stored, and the processing liquid is supplied to the processing tank 34 by the processing liquid circulation unit 43.

The chemical liquid supply unit 41 supplies the processing liquid to the liquid processing unit 38. The chemical liquid supply unit 41 connects a processing liquid supply source 45 configured to supply the processing liquid to the outer tank 44 of the liquid processing unit 38 via a flow rate regulator 46. The flow rate regulator 46 is connected to the controller 7, and the opening/closing control and the flow rate control of the flow rate regulator 46 are performed by the controller 7.

The processing liquid circulation unit 43 forms a circulation flow path 49 between the bottom portion of the outer tank 44 of the liquid processing unit 38 and the bottom portion of the processing tank 34. In the circulation flow path 49, a pump 50, a filter 51, and a heater 52 are provided in order. The pump 50 and the heater 52 are connected to the controller 7, and driven and controlled by the controller 7. Then, the processing liquid circulation unit 43 circulates the processing liquid from the outer tank 44 to the processing tank 34 by driving the pump 50. At that time, the processing liquid is heated by the heater 52.

In addition, the processing liquid circulation unit 43 forms a concentration measurement flow path 53 between the outer tank 44 and the middle of the circulation flow path 49 (the downstream side of the heater 52). In the concentration measurement flow path 53, an opening/closing valve 54 and a concentration sensor 55 are provided in order. The opening/closing valve 54 is connected to the controller 7, and is controlled to be opened/closed by the controller 7. In addition, the concentration sensor 55 is connected to the controller 7, and measures the concentration of the processing liquid flowing through the concentration measurement flow path 53 according to an instruction from the controller 7, and notifies the controller 7 of the concentration.

The processing liquid discharge unit 40 connects a drainage flow path 56 communicating with an external drainage pipe to the bottom portion of the processing tank 34 of the liquid processing unit 38, and an opening/closing valve 57 is provided in the drainage flow path 56. The opening/closing valve 57 is connected to the controller 7, and is controlled to be opened/closed by the controller 7.

The substrate liquid processing apparatus 1 is configured as described above, and processes the substrate 8 by controlling the operations of the respective sections (e.g., the carrier carry-in/out section 2, the lot forming section 3, the lot placing section 4, the lot transport section 5, and the lot processing section 6) according to, for example, a substrate liquid processing program stored in the storage medium 58.

Figure 3:
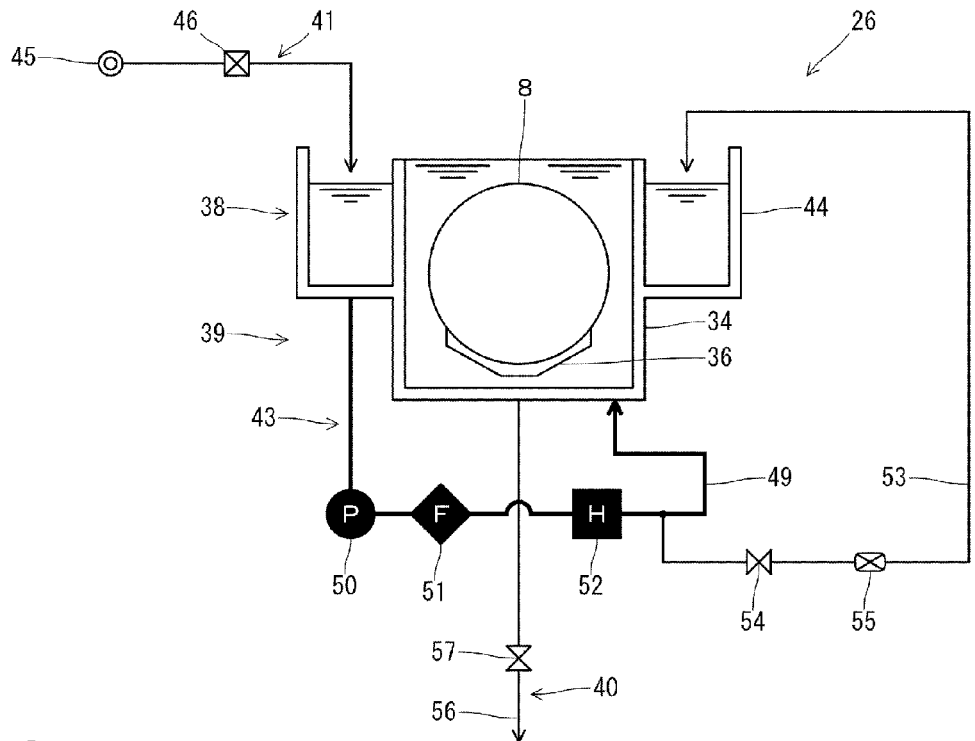
FIG. 3 is an explanatory view illustrating an operation of the etching apparatus during an etching process.

When the substrate 8 is etched by the substrate liquid processing apparatus 1, the processing liquid heated in the liquid processing unit 38 of the etching apparatus 26 to a predetermined temperature by the etching liquid supply unit 39 is generated and stored in the processing tank 34. Specifically, as illustrated in FIG. 3, the controller 7 drives the pump 50 to circulate the processing liquid in the circulation flow path 49, and drives the heater 52 to maintain the temperature of the processing liquid to a predetermined temperature. Then, the substrate 8 is immersed in the processing tank 34 in which the processing liquid having a predetermined concentration and a predetermined temperature is stored by the substrate lifting mechanism 36, whereby the substrate 8 is subjected to the etching process (liquid processing) with the processing liquid.

Figure 4:
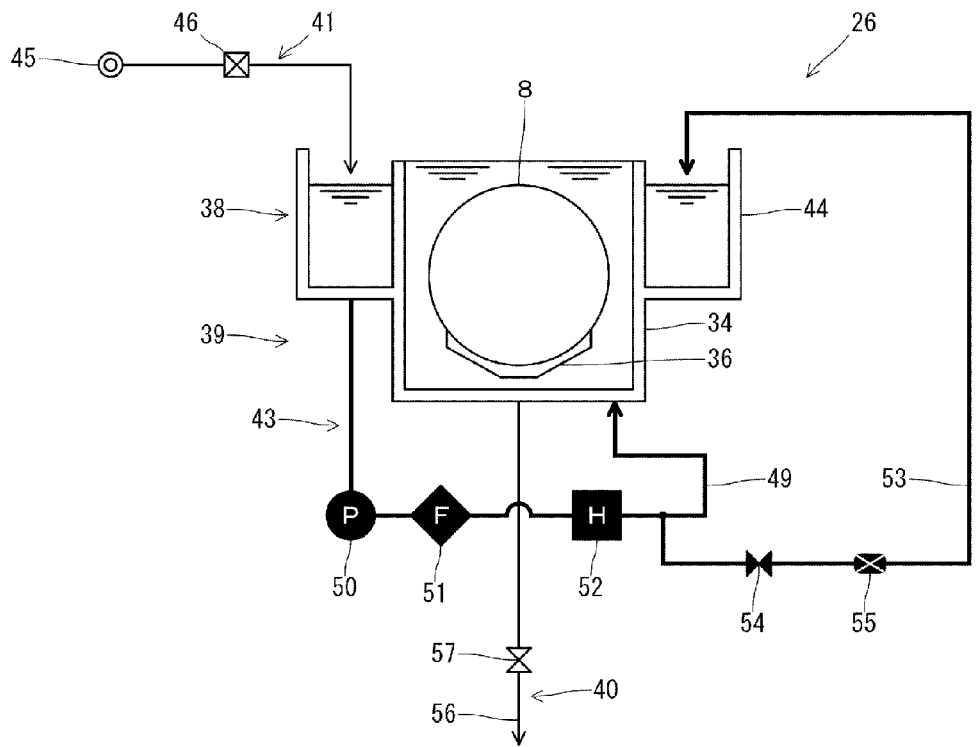
FIG. 4 is an explanatory view illustrating an operation of an etching apparatus during density measurement.

The controller 7 measures the concentration of the processing liquid with the concentration sensor 55 at a predetermined timing. At that time, as illustrated in FIG. 4, the pump 50 is driven to circulate the processing liquid in the circulation flow path 49, as in the liquid processing, and the heater 52 is driven to maintain the temperature of the treatment liquid at a predetermined temperature. Further, in the state in which the opening/closing valve 54 is opened, a part of the processing liquid flowing through the circulation flow path 49 is caused to flow into the concentration measurement flow path 53, and the concentration of the treatment liquid is measured by the concentration sensor 55. After the concentration measurement, the opening/closing valve 54 is returned to the closed state, and all the processing liquid is circulated in the circulation flow path 49.

Conventionally, for example, as illustrated in FIG. 5A, by immersing, for a predetermined process time tn, a substrate 8 having a metal layer 62 (e.g., tungsten) covering the inside and outside of a recess 61 formed in an insulating film 60 (e.g., a silicon oxide film) in a processing liquid (e.g., an etching liquid obtained by mixing, for example, phosphoric acid, nitric acid, acetic acid, and pure water) heated to a temperature (e.g., 70° C.) at which the etching rate is high, the metal layer 62 inside the recess 61 is not etched as much as possible, and the remaining film of the metal layer 62 outside the recess 61 is etched as thin as possible.

During the etching process, it is difficult to perform etching in such a manner that the metal layer 62 inside the recess 61 is not etched as much as possible and the remaining film of the metal layer 62 outside the recess 61 is etched as thin as possible or only the metal layer 62 outside the recess 61 is etched, and there is a possibility that the metal layer 62 inside the recess 61 is also etched.

Therefore, in the substrate liquid processing apparatus 1, first, the surface of the substrate 8 is etched with a processing liquid in the state in which the etching rate (first etching rate) for the metal layer 62 is high (first coating removal step (step 1)), and then the surface of the substrate 8 is etched with a processing liquid in the state in which the etching rate (second etching rate) for the metal layer 62 is low (second coating removal step (step 2)). The etching rate may be changed by changing the type of the etching liquid or by changing the concentration of the etching liquid. However, in order to change the type or the concentration of the etching liquid during the etching process, a time and a separate mechanism are required, which may result in a decrease in throughput and an increase in processing cost. For this reason, here, the etching rate is changed by changing the temperature of the etching solution. In the substrate liquid processing apparatus 1, since the heater 52 has already been provided in order to set the etching liquid to a predetermined temperature, the temperature of the etching liquid may be changed by using this heater 52 as a temperature adjusting unit. As a result, for example, a separate mechanism is not required to change the etching rate, and the etching rate can be smoothly changed in a short time.

Specifically, as illustrated in FIG. 5B, in the first coating removal step (step 1), the controller 7 controls the heater 52 in the etching liquid supply unit 39 to heat the processing liquid to a first temperature (e.g., 70° C.) at which the etching rate is high so as to generate a processing liquid in the state in which the etching rate is high. The processing liquid is supplied from the etching liquid supply unit 39 to the liquid processing unit 38, and the substrate 8 is etched in the liquid processing unit 38. At that time, the etching process time is set to a first process time t1, and the etching amount of the metal layer 62 is set to a first etching amount V1 (see, e.g., FIG. 6A).

Thereafter, in the second coating removal step (step 2), the controller 7 generates a processing liquid in the state in which the etching rate for the metal layer 62 is low) by heating (adjusting the temperature of) the processing liquid to a second temperature (e.g., 60° C.) lower than the first temperature in the etching liquid supply unit 39. The processing liquid is supplied from the etching liquid supply unit 39 to the liquid processing unit 38, and the substrate 8 is etched in the liquid processing unit 38. At that time, the etching process time is set to a second process time t2, and the etching amount of the metal layer 62 remaining outside the recess 61 is set to a second etching amount V2 (see, e.g., FIG. 6B). Here, the first and second etching rates (the temperatures of the etching liquid) or the first and second process times t1, t2 may be set such that the first etching amount V1 in the first coating removal step (step 1) is larger than the second etching amount V2 in the second coating removal step (step 2).

In this way, in the first process time t1, it is possible to remove a large amount (the first etching amount V1) of the metal layer in a short time with the processing liquid in the state in which the etching rate is high. At this time, a thin metal layer 62 (second etching amount V2) is left outside the recess 61 to such an extent that the metal layer 62 inside the recess 61 is not exposed. Thereafter, in the second processing time t2, the metal layer 62 (the second etching amount V2) remaining outside the recess 61 is gradually and precisely removed with the processing liquid in the state in which the low etching rate is low, whereby it is possible to prevent the metal layer 62 inside the recess 61 from being etched as much as possible (FIG. 6C).

Figure 7A:
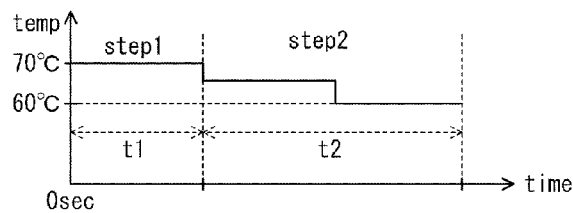
FIGS. 7A to 7C are explanatory views illustrating changes in time and temperature in another embodiment during an etching process.
Figure 7B:
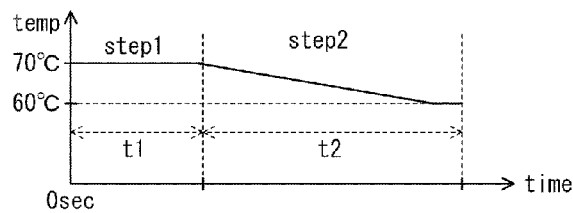
Figure 7C:
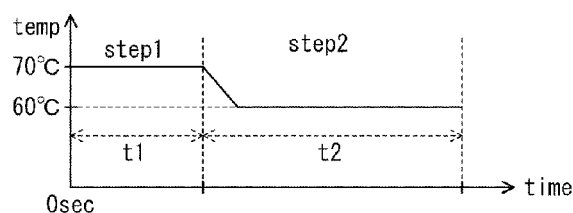
Figure 8:
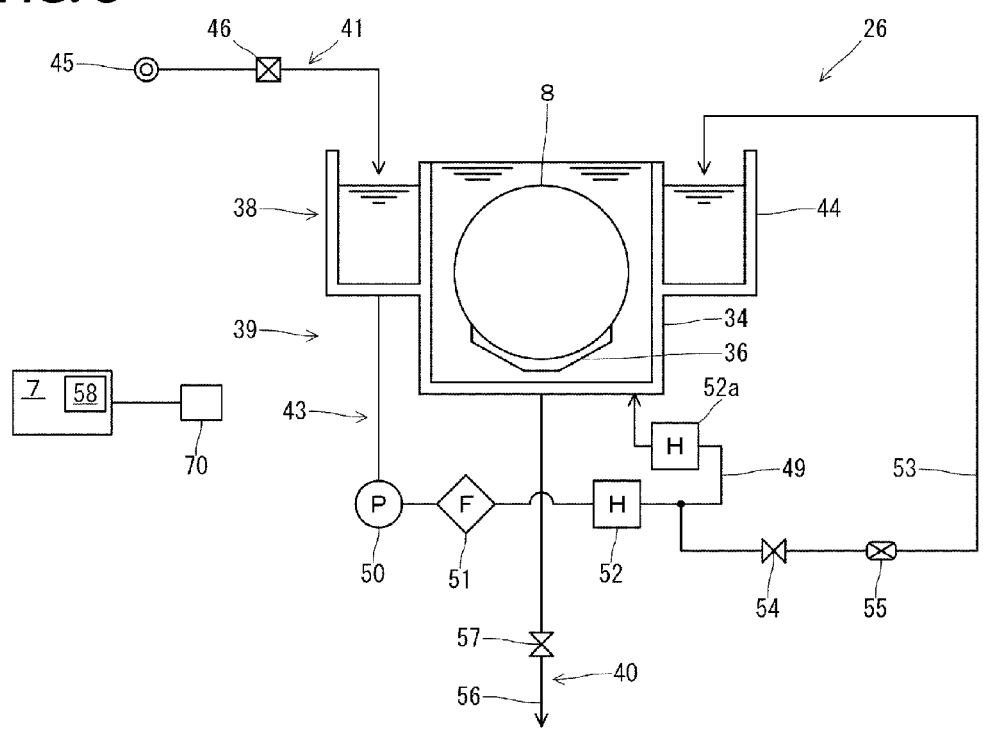
FIG. 8 is an explanatory view illustrating another type of an etching apparatus.

In the above embodiment, the process is performed in the state in which the temperature of the processing liquid at the second process time (second temperature) is set to 60° C. However, the process is not limited thereto, and the temperature of the processing liquid in the second process time may be lowered stepwise to, for example, 65° C. and 60° C. (FIG. 7A). In addition, at the beginning of the second process time, the power supply of the heater 52 for heating the processing liquid may be turned off so as to continuously lower the temperature of the processing until the temperature of the processing liquid reaches 60° C. Thereafter, the power supply of the heater 52 may be turned on so as to set the temperature of the processing liquid to 60° C. (FIG. 7B). In addition, at the beginning of the second process time, the power supply of the heater 52 for heating the processing liquid may be turned off so as to rapidly lower the temperature of the processing liquid to 60° C. by a heat source 52a (e.g., a cooler) provided on the downstream side of the heater 52. Thereafter, the power supply of the heat source 52a may be turned off and the power supply of the heater 52 may be turned on so as to set the temperature of the processing liquid to 60° C. (FIG. 7C and FIG. 8).

In the above embodiment, an atmospheric pressure sensor 70 (an atmospheric pressure detection unit) for detecting the atmospheric pressure is connected to the controller 7. When an atmospheric pressure detected by the atmospheric pressure sensor 70 (detected atmospheric pressure) and a preset atmospheric pressure (set atmospheric pressure: 1013 hPa as a reference atmospheric pressure) are different from each other, set temperatures (the first temperature and the second temperature) may be corrected (changed). As a result, when the atmospheric pressure fluctuates, the temperature of the processing liquid fluctuates and the amount of the metal layer 62 to be removed changes. Thus, the metal layer 62 cannot be removed with high accuracy. However, even when the atmospheric pressure fluctuates, the metal layer 62 can be removed by the same amount as the amount of the metal layer 62 to be removed at the atmospheric pressure (set atmospheric pressure). In addition, correction of the set temperature can be made by preparing a correspondence table in which the atmospheric pressure and the temperature to be corrected correspond to each other in advance and the set temperature can be corrected according to the correspondence table. As a result, the temperature of the etching liquid supplied from the etching liquid supply unit 39 is corrected according to the detected atmospheric pressure such that the amount of the coating film removed at the detected atmospheric pressure becomes equal to the amount of the coating film removed at the preset atmospheric pressure (set atmospheric pressure).

In the above embodiments, the etching liquid is a mixed liquid of, for example, phosphoric acid, nitric acid, acetic acid, and pure water. However, the etching liquid is not limited thereto and may be a mixed liquid of, for example, phosphoric acid and pure water and may be a mixed liquid of other chemical liquids.

DESCRIPTION OF SYMBOLS

1: substrate liquid processing apparatus
7: controller
8: substrate
38: liquid processing unit
39: etching liquid supply unit

What is claimed is:

1. A liquid processing method comprising:
providing a substrate having a recess and covered with a coating film inside and outside of the recess;
a first coating film removal step of supplying an etching liquid for removing the coating film to the substrate positioned in a processing tank, setting a temperature of the etching liquid provided from the processing tank to a first temperature so as to attain a first etching rate and removing the coating film outside the recess of the substrate positioned in the processing tank in a first process time; and
thereafter, a second coating film removal step of supplying the etching liquid for removing the coating film to the substrate positioned in the processing tank, setting the temperature of the etching liquid provided from the processing tank to a second temperature so as to attain a second etching rate lower than the first etching rate and removing the coating film outside the recess of the substrate positioned in the processing tank in a second process time while leaving the coating film inside the recess.

2. The liquid processing method of claim 1, wherein an amount of the coating film removed in the first coating film removal step is larger than an amount of the coating film removed in the second coating film removal step.

3. The liquid processing method of claim 2, wherein the second temperature is lowered continuously or stepwise during a lapse of the second process time.

4. The liquid processing method of claim 2, wherein the second coating film removal step removes all of the coating film outside the recess.

5. The liquid processing method of claim 2, wherein an atmospheric pressure is detected during either one of the first coating film removal step or the second coating film removal step, and
the temperature of the etching liquid is corrected according to the detected atmospheric pressure such that the amount of the coating film removed at the detected atmospheric pressure becomes equal to the amount of the coating film removed at the preset atmospheric pressure.

6. A liquid processing apparatus comprising:
a processing tank configured to hold a substrate having a recess and covered with a coating film inside and outside of the recess;
a circulation line including a heater and connected to the processing tank, the circulation line being configured to supply an etching liquid to the surface of the substrate in order to remove a portion of the coating film that covers the surface outside the recess; and
a controller configured to control an overall operation of the liquid processing apparatus,
wherein the controller is configured to: supply the etching liquid for removing the coating film to the substrate positioned in a processing tank, set a temperature of the etching liquid supplied from the processing tank to the surface of the substrate positioned in the processing tank to a first temperature so as to attain a first etching rate and the coating film outside the recess is removed in a first process time; and thereafter, supply the etching liquid for removing the coating film to the substrate positioned in the processing tank, set the temperature of the etching liquid supplied from the processing tank to the surface of the substrate positioned in the processing tank to a second temperature so as to attain a second etching rate lower than the first etching rate and the coating film outside the recess is removed while leaving the coating film inside the recess in the second process time.

7. The liquid processing apparatus of claim 6, wherein the controller performs a control such that an amount of the coating film removed in the first process time is larger than an amount of the coating film removed in the second process time.

8. The liquid processing apparatus of claim 7, wherein the controller performs a control such that the second temperature of the etching liquid is lowered continuously or stepwise during a lapse of the second process time.

9. The liquid processing apparatus of claim 7, wherein the controller performs a control such that all of the coating film outside the recess is removed while leaving the coating film inside the recess in the second process time.

10. The liquid processing apparatus of claim 7, wherein the controller makes it possible to acquire and detect signals from a processing liquid temperature detector and an atmospheric pressure detector, and corrects the temperature of the etching liquid according to a detected atmospheric pressure such that an amount of the coating film removed at an acquired and detected atmospheric pressure becomes equal to an amount of the coating film removed at the preset atmospheric pressure (set atmospheric pressure).

11. A non-transitory computer-readable storage medium for storing a program that, when executed by a computer configured to control an operation of a liquid processing apparatus, causes the computer to control the liquid processing apparatus so as to execute the liquid processing method of claim 1.

12. The liquid processing method of claim 1, wherein the second temperature is lowered continuously or stepwise during a lapse of the second process time.

13. The liquid processing method of claim 12, wherein the second coating film removal step removes all of the coating film outside the recess.

14. The liquid processing method of claim 1, wherein the second coating film removal step removes all of the coating film outside the recess.

15. The liquid processing method of claim 1, wherein an atmospheric pressure is detected during either one of the first coating film removal step or the second coating film removal step, and the temperature of the etching liquid is corrected according to the detected atmospheric pressure such that the amount of the coating film removed at the detected atmospheric pressure becomes equal to the amount of the coating film removed at the preset atmospheric pressure.

16. The liquid processing apparatus of claim 6, wherein the controller performs a control such that the second temperature of the etching liquid is lowered continuously or stepwise during a lapse of the second process time.

17. The liquid processing apparatus of claim 8, wherein the controller performs a control such that all of the coating film outside the recess is removed while leaving the coating film inside the recess in the second process time.

18. The liquid processing apparatus of claim 6, wherein the controller performs a control such that all of the coating film outside the recess is removed while leaving the coating film inside the recess in the second process time.

19. The liquid processing method of claim 1, wherein the etching liquid is heated to the first temperature and the second temperature using a heater positioned in a circulation line connected to the processing tank.

20. The liquid processing apparatus of claim 6, further comprising a heater positioned in a circulation line connected to the processing tank, the heater configured to heat the etching liquid to the first temperature and the second temperature.

* * * * *